United States Patent
Ratell, Jr. et al.

(10) Patent No.: US 7,436,270 B2
(45) Date of Patent: Oct. 14, 2008

(54) STRUCTURE AND METHOD FOR IMPROVING THE RELIABILITY OF SURFACE MOUNTED CERAMIC DUPLEXERS

(75) Inventors: Joseph M. Ratell, Jr., Indianapolis, IN (US); Michael T. Dolce, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 250 days.

(21) Appl. No.: 11/313,204

(22) Filed: Dec. 20, 2005

(65) Prior Publication Data
US 2007/0139134 A1    Jun. 21, 2007

(51) Int. Cl.
*H01P 5/12* (2006.01)

(52) U.S. Cl. .......................... 333/134; 333/247; 439/74

(58) Field of Classification Search ................. 333/134, 333/247; 439/74, 44
See application file for complete search history.

(56) References Cited

U.S. PATENT DOCUMENTS

| | | | |
|---|---|---|---|
| 4,426,631 A * | 1/1984 | D'Avello et al. ............. 333/202 |
| 4,769,270 A * | 9/1988 | Nagamatsu et al. ......... 428/131 |
| 5,017,738 A * | 5/1991 | Tsuji et al. ................. 174/94 R |
| 5,639,696 A * | 6/1997 | Liang et al. ............. 228/180.22 |
| 5,816,481 A * | 10/1998 | Economy et al. ............ 228/207 |
| 6,765,805 B2 * | 7/2004 | Naruse et al. ................ 361/803 |
| 7,253,704 B2 * | 8/2007 | Park et al. .................... 333/133 |
| 7,274,129 B2 * | 9/2007 | Ueda et al. .............. 310/313 R |

* cited by examiner

*Primary Examiner*—Robert J. Pascal
*Assistant Examiner*—Kimberly E Glenn
(74) *Attorney, Agent, or Firm*—Jimmy L. Funke

(57) ABSTRACT

A duplexer assembly is provided and includes a circuit board and a duplexer connected to the circuit board by a joint material, wherein the joint material provides a joint thickness of at least about 10 mils.

18 Claims, 4 Drawing Sheets

STRUCTURE AND METHOD FOR IMPROVING THE RELIABILITY OF SURFACE MOUNTED CERAMIC DUPLEXERS

BACKGROUND

The present application is directed to duplexer assemblies and, more particularly, to structures and method for improving the reliability of duplexer assemblies.

Ceramic duplexers typically are used in various electronic communication devices. In particular, monolithic ceramic duplexers often are used in cellular telephone circuits and the like to facilitate the transmission and receipt of communication signals.

Ceramic duplexers may include a multipole shaped ceramic piece adapted to connect (e.g., with soft solder or the like) to various metal traces on a printed circuit board. Such ceramic duplexers often are relatively large as compared to the size of the printed circuit board. For example, a ceramic duplexer may be about 1.5 inches long, about 0.5 inches wide and about 0.25 inches tall. The connection thickness between the duplexer and the printed circuit board may be in the range of about 1 to about 5 mils, as commonly obtained using commercial electronic assembly methods.

Typically, there is a significantly large mismatch between the coefficients of thermal expansion of the printed circuit board and the ceramic duplexer. For example, an epoxy/glass printed circuit board may have a coefficient of thermal expansion of about 16 parts per million per ° C. ("ppm/° C.") and a ceramic duplexer may have a coefficient of thermal expansion of about 5 ppm/° C.

Accordingly, due to the significant mismatch between the coefficients of thermal expansion of the printed circuit board and the ceramic duplexer, as well as the relatively large size of the duplexer, the connection between the duplexer and the printed circuit board is prone to failure. In particular, the joint connecting the duplexer to the traces on the printed circuit board is prone to cracking when subjected to thermal cycling in the range of about −40° C. to about 85° C.

Attempts to address the connection failures by increasing the surface area of the duplexer/circuit board connection (e.g., increasing the surface area of the solder joint) have failed to remedy the problem. In some attempts, increasing the surface area of the connection resulted in a transfer of the stress generated by the coefficient of thermal expansion mismatch to the duplexer, thereby cracking the duplexer.

Accordingly, there is a need for an apparatus and method for connecting a duplexer to a circuit board such that the duplexer assembly is capable of withstanding the stresses typically associated with thermal cycling.

SUMMARY

In one aspect, a duplexer assembly is provided and includes a circuit board and a duplexer connected to the circuit board by a joint material, wherein the joint material provides a joint thickness of at least about 10 mils.

In another aspect, a duplexer assembly is provided and includes a duplexer having at least one connection pad disposed on a surface thereof, a circuit board having at least one trace disposed on a surface thereof, the trace being connected to the connection pad by a joint material, and at least one spacer positioned between the duplexer and the circuit board, the spacer increasing the distance between the connection pad and the trace.

In another aspect, a method for connecting a duplexer having at least one connection pad to a circuit board having at least one trace is provided. The method includes the steps of positioning a spacer between the duplexer and the circuit board to provide an increased space between the connection pad and the trace, positioning a solder material in the increased space between the connection pad and the trace and increasing a temperature of the solder material such that the solder material melts and electrically connects the connection pad to the trace.

Other aspects will become apparent from the following description, the accompanying drawings and the appended claims.

DETAILED DESCRIPTION

Figure 1:
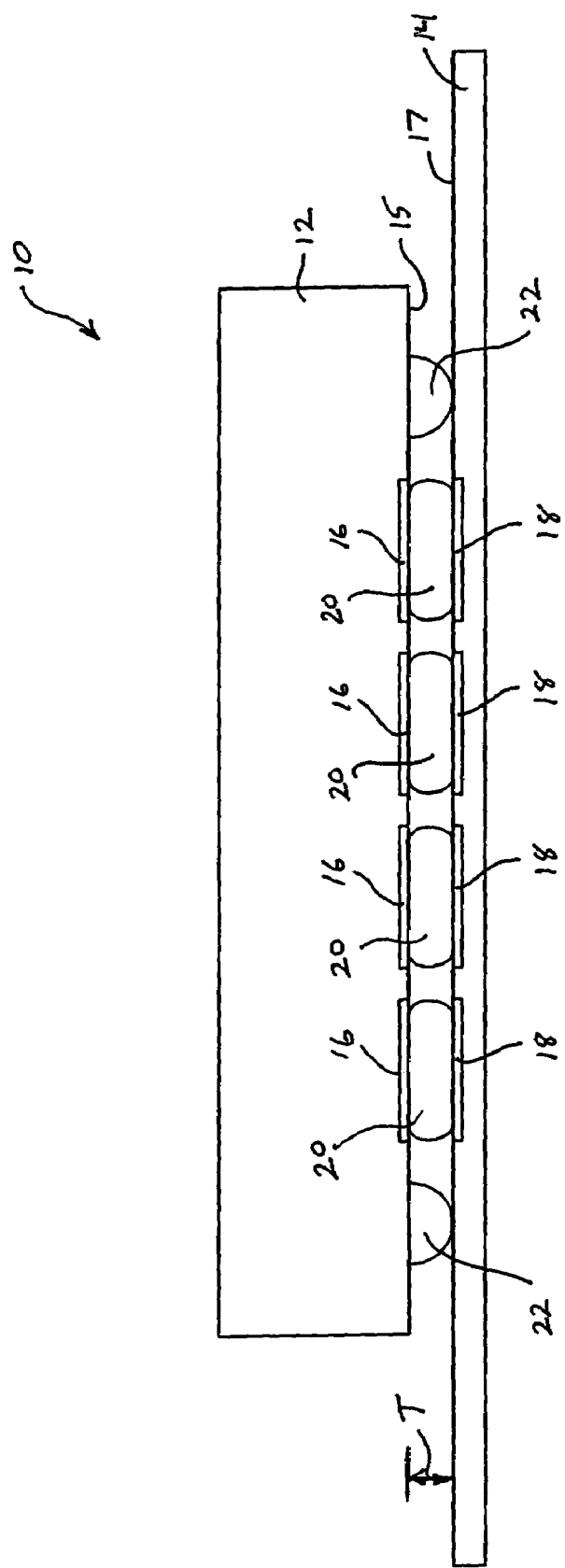
FIG. 1 is a front elevational view of a first aspect of an improved duplexer assembly.

As shown in FIG. 1, a duplexer assembly, generally designated 10, may include a duplexer 12 and a printed circuit board 14. The duplexer 12 may be any duplexer known in the art, such as a ceramic duplexer, and may include a generally planar engaging surface 15 having connection pads 16 thereon. The printed circuit board 14 may be any circuit board known in the art, such as a glass/epoxy circuit board, and may include a generally planar engaging surface 17 having traces 18 thereon. The traces 18 may be substantially aligned with the connection pads 16.

The pads 16 may be connected to the traces 18 by joints 20, which may have a stand-off height or joint thickness T separating the duplexer 12 from the printed circuit board 14. The thickness T may be generally uniform across the joints 20 or may vary such that the joints 20 have an average overall thickness. The joints 20 may be soft solder or the like or any other material capable of making a physical and/or electrical connection between the duplexer 12 and the printed circuit board 14.

It has been discovered that the stress generated by the coefficient of thermal expansion mismatch between the duplexer 12 and the printed circuit board 14 may be managed by increasing the thickness T of the joints 20 between the duplexer 12 and the printed circuit board 14. In one aspect, the joint thickness T may be about 10 to about 50 mils (i.e., thousandths of an inch). In another aspect, the joint thickness T may be about 25 to about 100 mils. In another aspect, the joint thickness T may be increased by about 2 to about 100 times.

Figure 2:
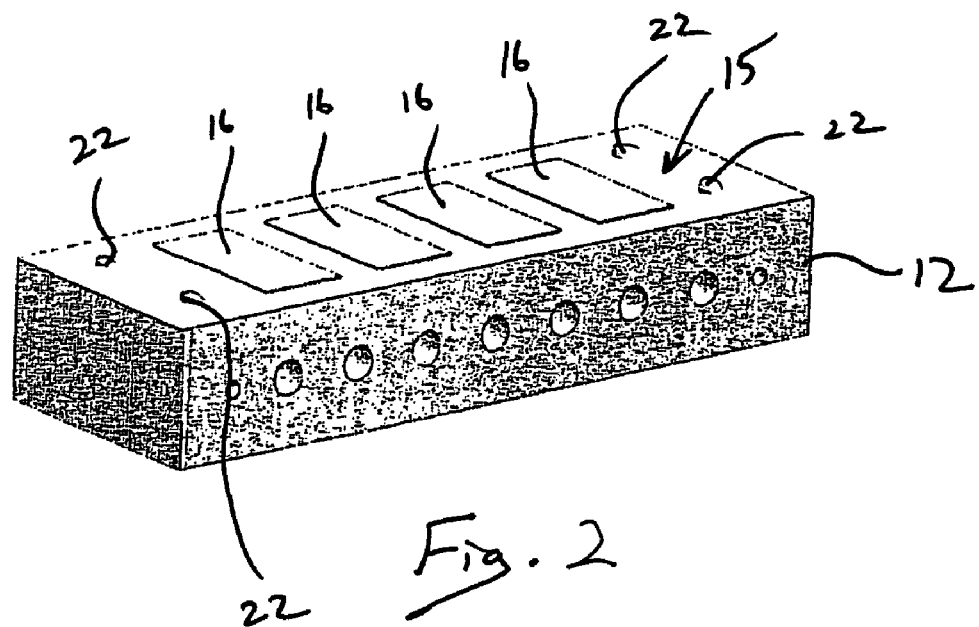
FIG. 2 is a front perspective view of the duplexer of the assembly of FIG. 1 in an inverted position to clearly show the electrical contacts and spacers.

Therefore, referring to FIGS. 1 and 2, a first aspect of a duplexer 12 may be provided with four spacers 22 extending from the engaging surface 15 of the duplexer 12 to increase the joint thickness T between the duplexer 12 and the circuit board 14. Alternatively, one, two, three, five or more spacers 22 may extend from the duplexer 12 in order to maintain a consistent stand-off height across the duplexer 12.

As shown in FIGS. 1-3 and 6, the spacers 22 may be generally hemispherical bumps or stand-offs extending from the engaging surface 15, wherein the radius of the bumps generally corresponds to the joint thickness T. Those skilled in the art will appreciate that the spacers 22 may have various shapes and geometries and may be positioned at various locations on the duplexer 12 such that the duplexer 12 is spaced from the circuit board 14.

Figure 3:
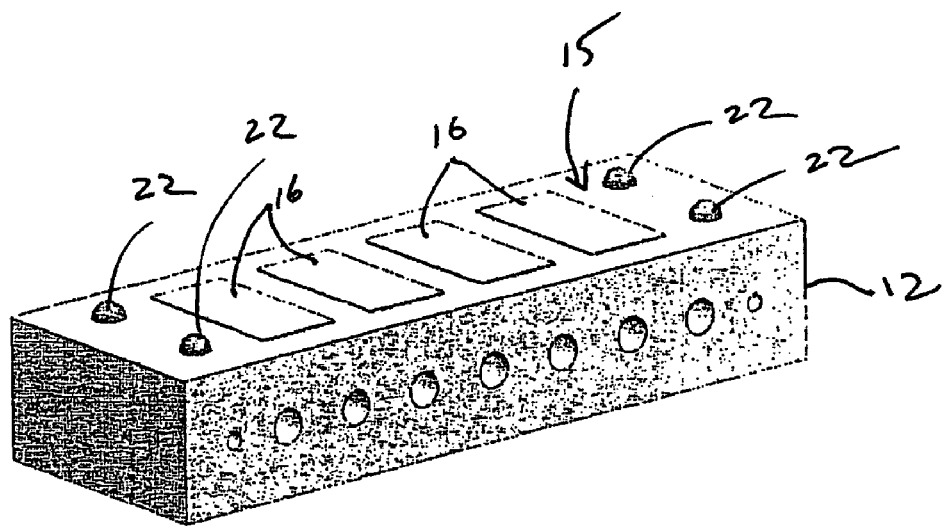
FIG. 3 is a front perspective view of a first alternative aspect of the duplexer of FIG. 2.

As shown in FIGS. 1 and 2, the spacers 22 may be integrally formed onto the duplexer 12 during the manufacturing/casting process. Alternatively, as shown in FIG. 3, the spacers 22 may be formed as an add-on component, thereby eliminating the need to retool existing manufacturing equipment. The add-on spacers 22 may be formed from any material capable of withstanding solder reflow temperatures and/or thermal cycling, such as unsolderable metals, thermoset or thermoplastic materials or ceramics. The add-on spacers 22 may be connected to the duplexer 12 or formed by any available means, such as brazing, welding, adhesives, press fitting, material forming, molding or the like. For example, the add-on spacers 22 may be formed from dots of adhesive applied to the duplexer 12. The adhesives may include, for example, epoxy, polyimide and silicone, and may be cured, if necessary.

Figure 6:
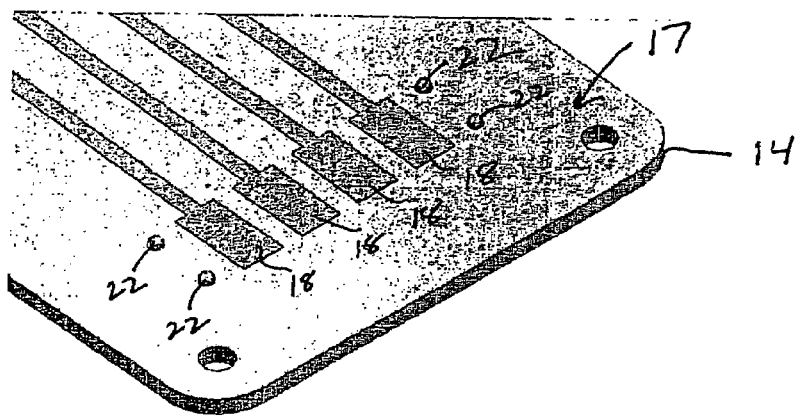
FIG. 6 is a front perspective view of a circuit board according to a first alternative aspect of the improved duplexer assembly of FIG. 1.

Alternatively, as shown in FIG. 6, the spacers 22 may be positioned on the engaging surface 17 of the printed circuit board 14. As discussed above, the spacers 22 may be integral to the circuit board 14 or may be provided as an add-on component and may be formed from any of the materials described above.

Figure 4:
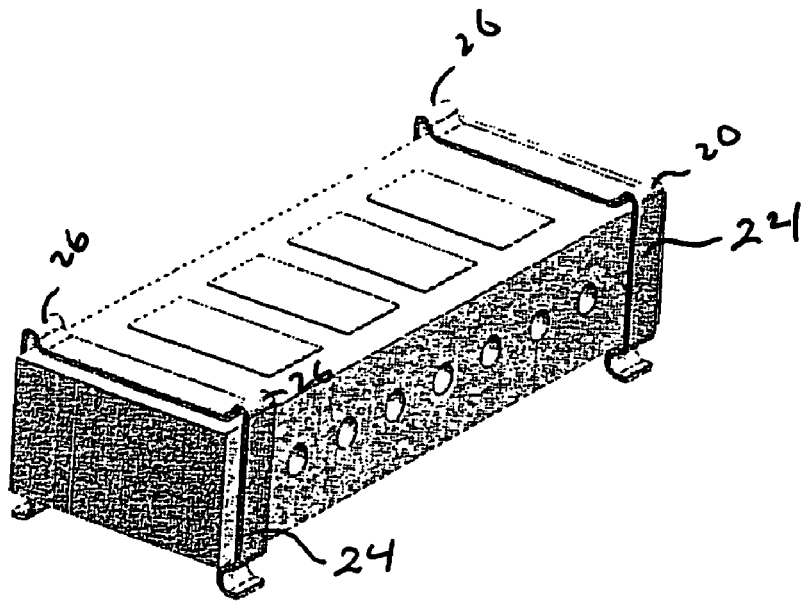
FIG. 4 is a front perspective view of a second alternative aspect of the duplexer of FIG. 2.

In another aspect, as illustrated in FIG. 4, the spacers 22 of FIGS. 1-3 and 6 may be replaced with rings or clips 24 capable of engaging the duplexer 12 to space the duplexer 12 from the printed circuit board 14 when the duplexer 12 is connected to the printed circuit board 14. In one aspect, the clips 24 may be removably connected to the duplexer 12 and may include a number of bumps or spacers 26 extending from the clip 24 to increase the distance T between the duplexer 12 and the circuit board 14.

Figure 5:
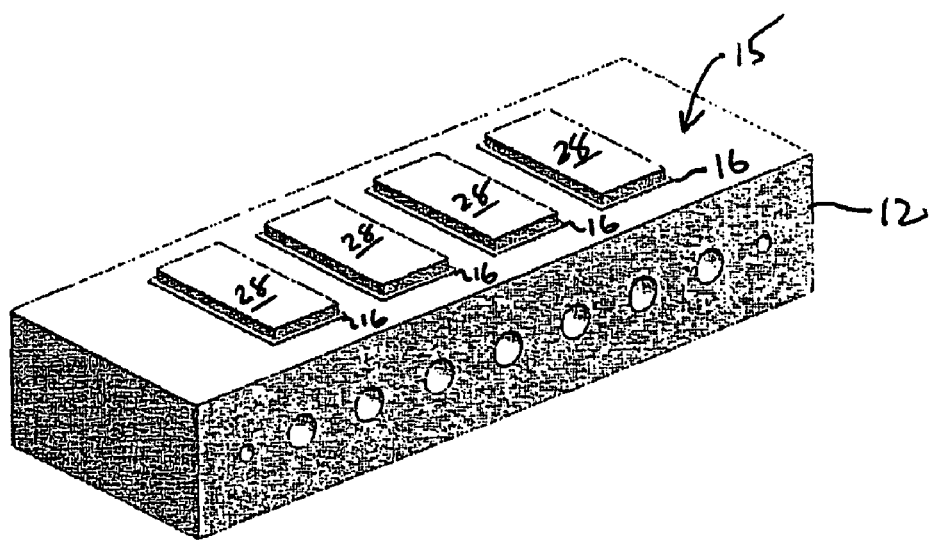
FIG. 5 is a front perspective view of a third alternative aspect of the duplexer of FIG. 2.

Alternatively, the joint thickness T may be increased by increasing the volume of solder (or other joint material) applied to the joints 20 and controlling the surface area to which the solder is allowed to spread. For example, as shown in FIG. 5, the pads 16 may be coated with a large or thick volume of solder 28. In one aspect, the solder 28 may be paste solder or solder pre-forms. The solder 28 may be aligned with the appropriate traces 18 on the circuit board 14 and the entire assembly 10 may be heated to an appropriate temperature to melt and wet the solder, thereby connecting the pads 16 to the traces 18. A layer of solder mask (not shown) may be applied to the circuit board 14 to control the spreading of the molten solder.

Figure 7:
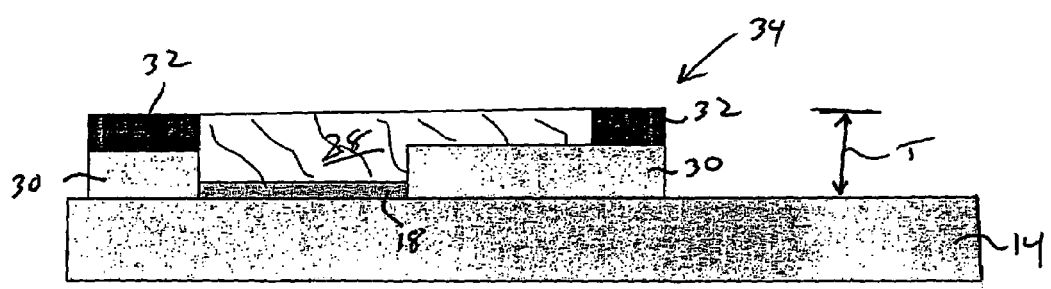
FIG. 7 is a front elevational view, in section, of a circuit board according to a second alternative aspect of the improved duplexer assembly of FIG. 1.

In another aspect, as shown in FIG. 7, a first layer of relatively thick solder mask 30 may be applied to the circuit board 14 to form a mold 34. The first layer 30 of the mold 34 may be applied such that only the traces 18 of the circuit board 14 are exposed. An additional layer of solder mask 32 may be applied over the first layer 30 to obtain an additional thickness T and/or alter the shape and/or geometry of the resulting solder mold 34. Those skilled in the art will appreciate that various layers of solder mask 30, 32 may be used, depending upon the desired thickness T and overall shape of the desired mold 34. The pads 16 of the duplexer 12 may then be aligned with the exposed solder 28 and the assembly 10 may be heated to an appropriate temperature such that the solder 28 melts, flows and connects the pads 16 to the traces 18. The resulting duplexer assembly 10 may have a joint thickness T, which may be substantially equal to or greater than the total solder mask thickness (i.e., the thickness of layers 30 and 32) due to the first layer 30 restricting the wettable area on the printed circuit board 14.

Although the improved duplexer assembly is shown and described with respect to certain aspects, modifications may occur to those skilled in the art upon reading the specification. The improved duplexer assembly includes all such modifications and is limited only by the scope of the claims.

What is claimed is:

1. A duplexer assembly comprising:
   a circuit board;
   a duplexer connected to said circuit board by a joint material, wherein said joint material provides a joint thickness of at least about 10 mils; and
   at least one spacer positioned between said duplexer and said circuit board, wherein said spacer is connected to and extends from said duplexer.

2. The assembly of claim 1 wherein said joint thickness is an average overall thickness of said joint material.

3. The assembly of claim 1 wherein said joint thickness is about 10 mils to about 50 mils.

4. The assembly of claim 1 wherein said joint thickness is about 25 mils to about 100 mils.

5. The assembly of claim 1 wherein said joint material is soft solders.

6. The assembly of claim 1 wherein said circuit board has a coefficient of thermal expansion that substantially differs from a coefficient of thermal expansion of said duplexer.

7. The assembly of claim 1 wherein said duplexer includes a ceramic material and said circuit board includes at least one of glass and an epoxy.

8. The assembly of claim 1 wherein said spacer is a generally hemispherical stand-off.

9. The assembly of claim 1 wherein said spacer is connected to and extends from said circuit board.

10. The assembly of claim 1 wherein said spacer is a deposit of adhesive applied to at least one of a surface of said duplexer and a surface of said circuit board.

11. The assembly of claim 1 wherein said spacer is a clip connected to said duplexer to increase the distance between said duplexer and said circuit board.

12. The assembly of claim 1 wherein said joint material is applied using a mold formed from a solder mask.

13. The assembly of claim 1 wherein at least one of said circuit board and said duplexer includes a relatively thick layer of pre-applied solder, said solder being adapted to form said joint material.

14. A duplexer assembly comprising:
   a duplexer having at least one connection pad disposed on a surface thereof;
   a circuit board having at least one trace disposed on a surface thereof, said trace being connected to said connection pad by a joint material; and
   at least one spacer positioned between said duplexer and said circuit board, said spacer increasing the distance between said connection pad and said trace, wherein said spacer is connected to and extends from said duplexer.

15. The assembly of claim 14 wherein said joint material is a soft solder.

16. The assembly of claim 14 wherein said distance between said connection pad and said trace is at least about 10 mils.

17. The assembly of claim 14 wherein said circuit board has a coefficient of thermal expansion that substantially differs from a coefficient of thermal expansion of said duplexer.

18. A method for connecting a duplexer having at least one connection pad to a circuit board having at least one trace, said method comprising the steps of:

positioning a spacer between said duplexer and said circuit board to provide an increased space between said connection pad and said trace, wherein said spacer is connected to and extends from said duplexer;

positioning a solder material in said increased space between said connection pad and said trace; and increasing a temperature of said solder material such that said solder material melts and electrically connects said connection pad to said trace.

* * * * *